(12) United States Patent  
Watanabe et al.

(10) Patent No.: US 7,609,576 B2  
(45) Date of Patent: Oct. 27, 2009

(54) SEMICONDUCTOR MEMORY DEVICE WITH REFRESH TRIGGER

(75) Inventors: Hiroshi Watanabe, Yokohama (JP); Tatsuya Tanaka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 228 days.

(21) Appl. No.: 11/845,337

(22) Filed: Aug. 27, 2007

(65) Prior Publication Data

US 2008/0181017 A1    Jul. 31, 2008

(30) Foreign Application Priority Data

Jan. 30, 2007    (JP) .............................. 2007-020016

(51) Int. Cl.  
*G11C 7/00* (2006.01)

(52) U.S. Cl. .................. 365/222; 365/185.25

(58) Field of Classification Search .................. 365/222, 365/185.25  
See application file for complete search history.

(56) References Cited

U.S. PATENT DOCUMENTS

| 6,614,704 | B2 * | 9/2003 | Dobler et al. ............... 365/222 |
| 7,075,284 | B2 | 7/2006 | Watanabe et al. |
| 7,324,399 | B2 * | 1/2008 | Jang et al. .................... 365/222 |
| 7,336,557 | B2 * | 2/2008 | Sawada .................... 365/233.1 |
| 2008/0074180 | A1 | 3/2008 | Watanabe et al. |

FOREIGN PATENT DOCUMENTS

| JP | 10-150171 | 6/1998 |
| JP | 2000-251483 | 9/2000 |
| JP | 2005-141827 | 6/2005 |
| JP | 2006-310662 | 11/2006 |

* cited by examiner

*Primary Examiner*—Anh Phung  
(74) *Attorney, Agent, or Firm*—Oblon, Spivak, McClelland, Maier & Neustadt, L.L.P.

(57) ABSTRACT

A semiconductor memory device includes a memory cell array including a plurality of memory cell transistors, an X decoder designating a position of an X axis of the memory cell, a Y decoder designating a position of a Y axis crossing the X axis, a controller collectively controlling operations of read, write and erase of the memory cell transistors via the X decoder and the Y decoder, a semiconductor time switch generating an output signal after a predetermined life time elapses without a power source, and a refresh trigger circuit receiving the output signal from the semiconductor time switch, and giving the controller instructions to transfer information stored in one area of the memory cell array to other area thereof to refresh the information.

20 Claims, 6 Drawing Sheets

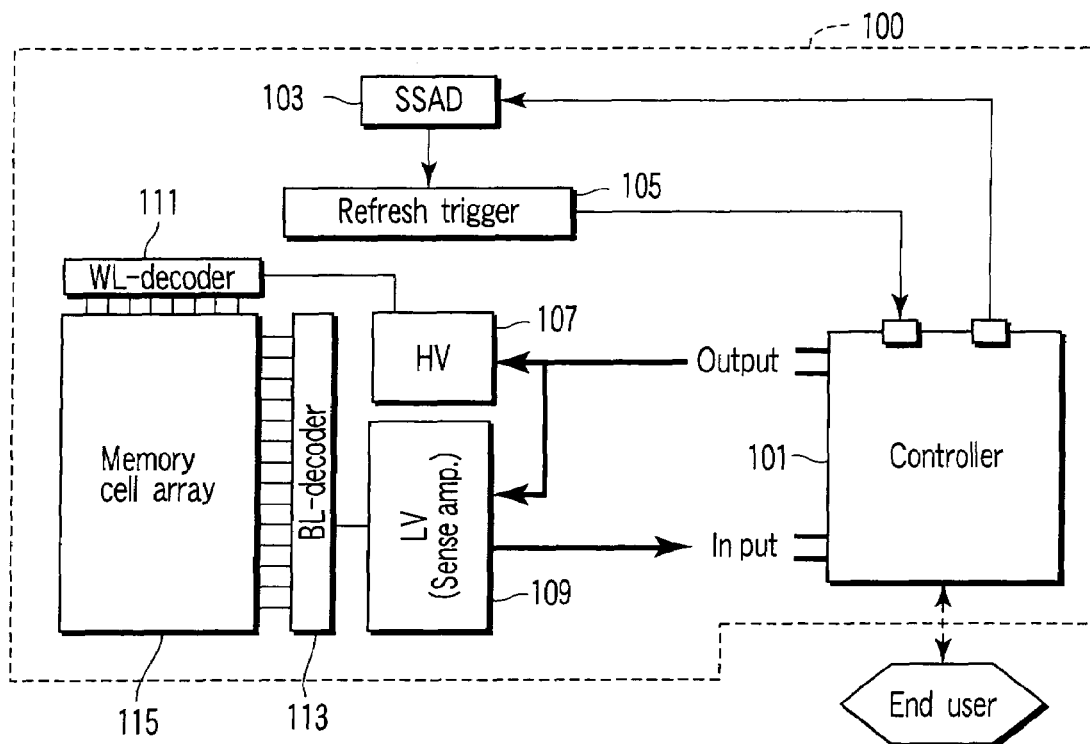
F I G. 1
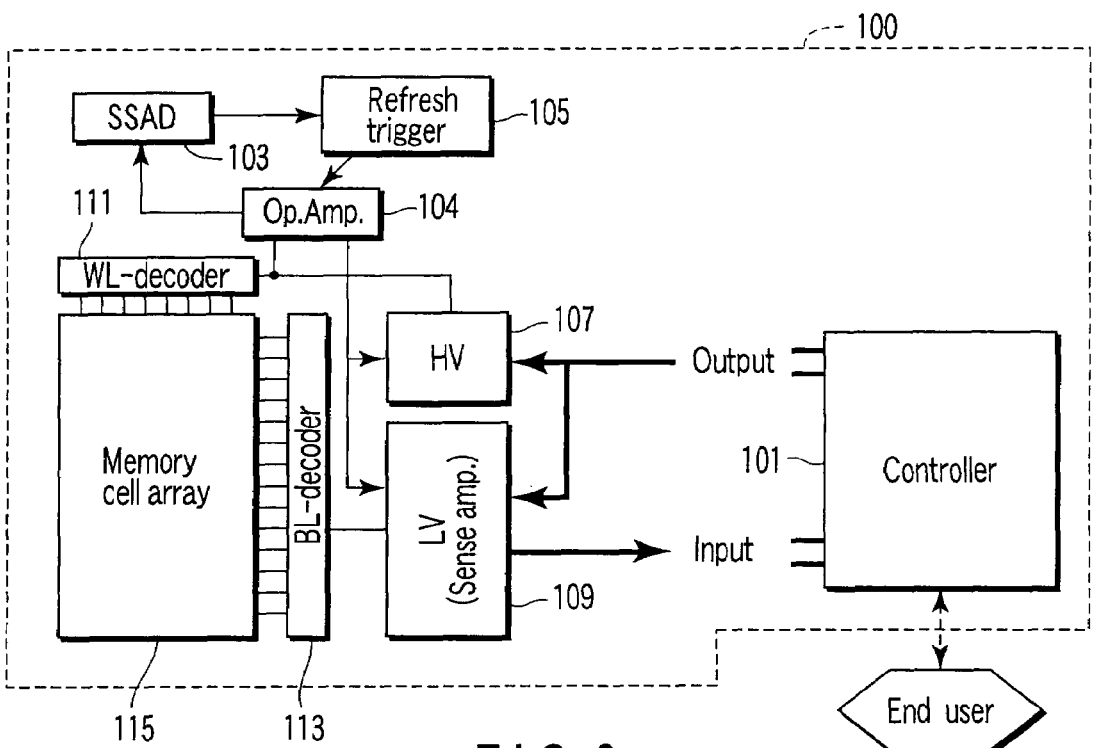
F I G. 2

$$\delta \mathrm{DOS} \equiv \sqrt{\mathrm{DOS_{Exact}}^2 - \mathrm{DOS_{Classical}}^2} \approx 6 \cdot \frac{\sqrt{2}}{\pi^2} \frac{\sqrt{q\Psi}}{\eta^3} m_{de}^{1.5}$$
$$\mathrm{DOS_{Exact}} = 6 \frac{\sqrt{2}}{\pi^2} \frac{\sqrt{E - E_C + q\Psi}}{\eta^3} m_{de}^{1.5}$$
$$\mathrm{DOS_{Classical}} = 6 \frac{\sqrt{2}}{\pi^2} \frac{\sqrt{E - E_C}}{\eta^3} m_{de}^{1.5}$$
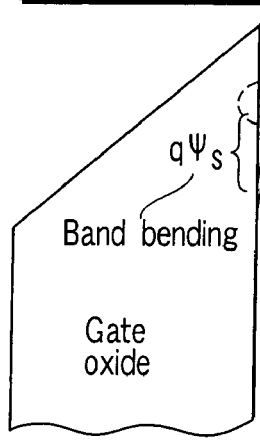
F I G. 7A
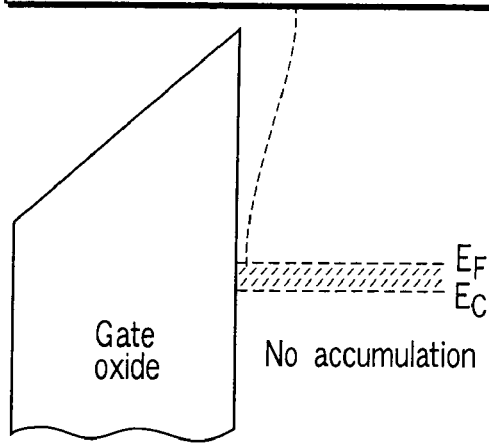
F I G. 7B
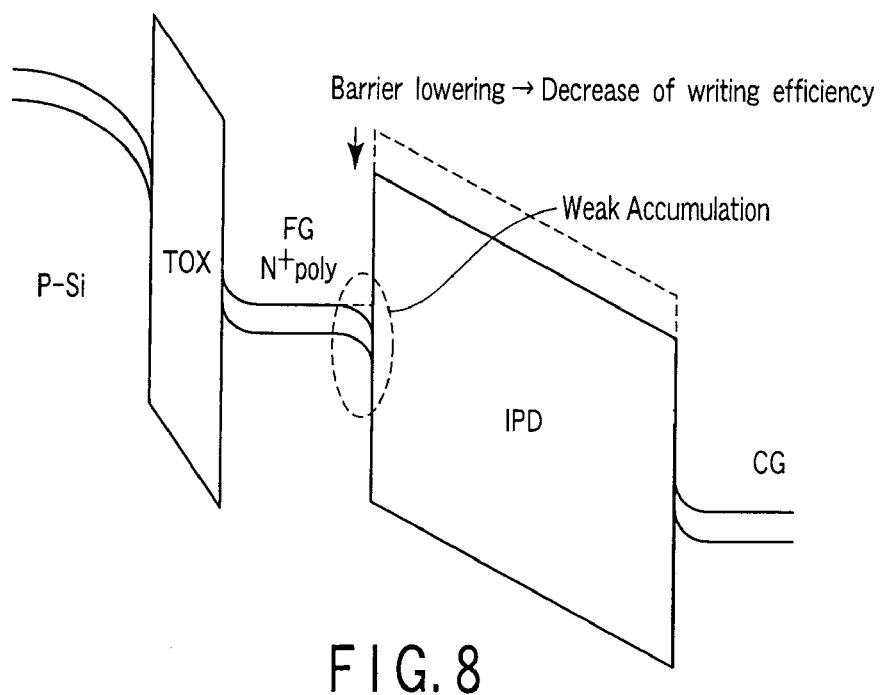
F I G. 8

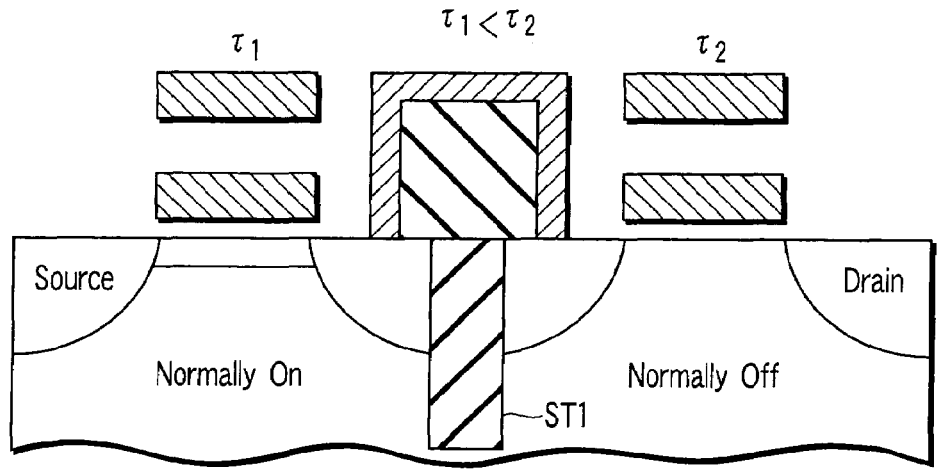
FIG. 11
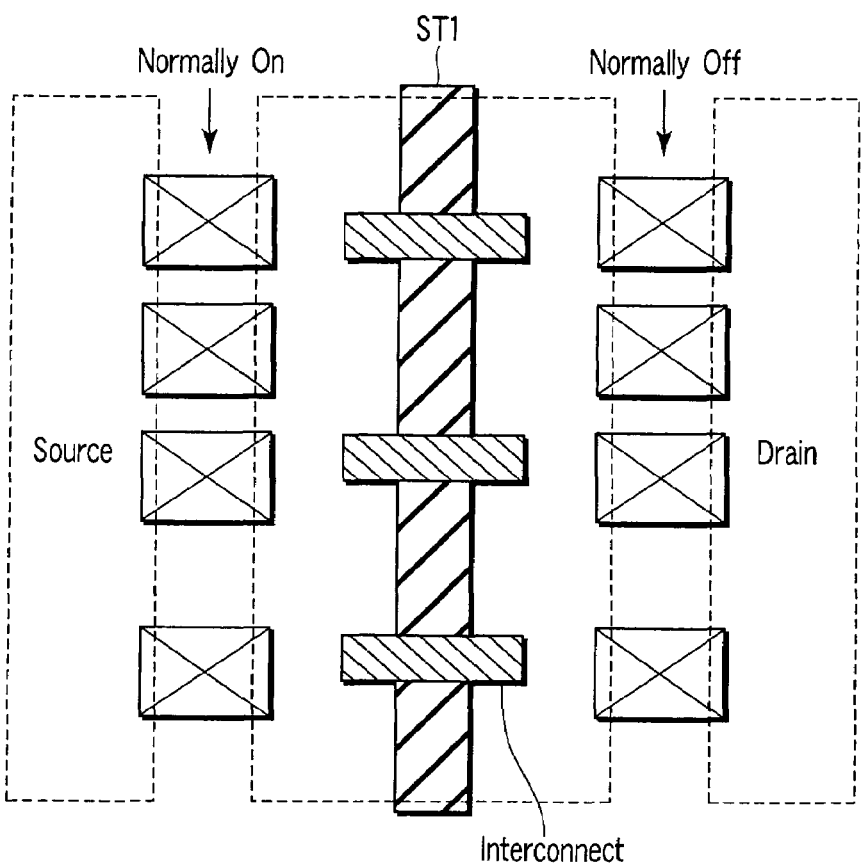
FIG. 12
FIG. 13

SEMICONDUCTOR MEMORY DEVICE WITH REFRESH TRIGGER

CROSS-REFERENCE TO RELATED APPLICATIONS

This application is based upon and claims the benefit of priority from prior Japanese Patent Application No. 2007-020016, filed Jan. 30, 2007, the entire contents of which are incorporated herein by reference.

BACKGROUND OF THE INVENTION

1. Field of the Invention

The present invention relates to a semiconductor memory device with a refresh trigger.

2. Description of the Related Art

The biggest features of a non-volatile memory cell used for a NAND flash memory are as follows. The non-volatile memory cell has a polysilicon floating gate whose surroundings are covered with an insulating film. A memory cell threshold voltage is varied in the following manner. Specifically, a voltage (control voltage) applied to a control gate nearest to a floating gate (FG) is controlled. A charge, that is, electrons are injected from a substrate to a floating gate via FN tunneling. Moreover, a voltage (erase voltage) applied to well is controlled to pull a charge out of the floating gate to vary the threshold voltage of the memory. If the foregoing variation is not wider than a fixed margin, the function as the memory device is lost.

Conversely, advances in scale reduction are made to reduce a bit price, and thereby, the following problem arises. The variation margin becomes narrow due to interference between cells and FG fringe capacitance; as a result, scale reduction is hindered. Moreover, the following phenomenon (IPD leak) makes control of variation difficult. According to the phenomenon, electrons tunnel through an inter-poly dielectric (IPD) held between a floating gate (FG) and a control gate (CG). For example, if the IPD leak occurs when electrons are injected from the substrate to the floating gate, the following problem arises. Namely, the threshold voltage of the memory cell is not established as a target value.

In order to solve the foregoing problems, the following method has been proposed (JP-A 2006-310662 [KOKAI]). According to the method, both ends of an inter-poly-insulating film held between the floating gate and the control gate are replaced with metal films.

However, the foregoing method includes using new substance and technique that is not used for a conventional non-volatile memory. For this reason, a large amount of costs are spent for the development of element forming technology. Resulting from affinity with process conditions peculiar to the non-volatile memory, it is very difficult to develop the foregoing new substance and new technology.

For this reason, it is desired to realize a non-volatile memory which can secure storage contents even if data retention time becomes short resulting from thinning of a tunnel film.

BRIEF SUMMARY OF THE INVENTION

According to one aspect of the invention, there is provided a semiconductor memory device, which includes:

a memory cell array including a plurality of memory cell transistors;

an X decoder designating a position of an X axis of the memory cell;

a Y decoder designating a position of a Y axis crossing the X axis;

a controller collectively controlling operations of read, write and erase of the memory cell transistors via the X decoder and the Y decoder;

a semiconductor time switch generating an output signal after a predetermined life time elapses without a power source; and a refresh trigger circuit receiving the output signal from the semiconductor time switch, and giving the controller instructions to transfer information stored in one area of the memory cell array to other area thereof to refresh the information.

BRIEF DESCRIPTION OF THE SEVERAL VIEWS OF THE DRAWING

FIG. 1 is a block diagram showing the configuration of a non-volatile semiconductor memory device with a refresh trigger according to one embodiment;

FIG. 2 is a block diagram showing the configuration of a non-volatile semiconductor memory device with a refresh trigger according to a modification example (2) of the invention;

FIG. 7A is a diagram, to explain a weak accumulation (storage) layer;

FIG. 7B is an energy band diagram when no accumulation is given;

FIG. 8 is an energy band diagram to explain an influence of a weak accumulation layer;

FIG. 11 is a table to explain an operation mode of the SSAD;

FIG. 12 is a cross-sectional view showing the structure realizing for one example of the operation mode of the SSAD; and FIG. 13 is a cross-sectional view showing the structure realizing for one example of the operation mode of the SSAD.

DETAILED DESCRIPTION OF THE INVENTION

Figure 3:
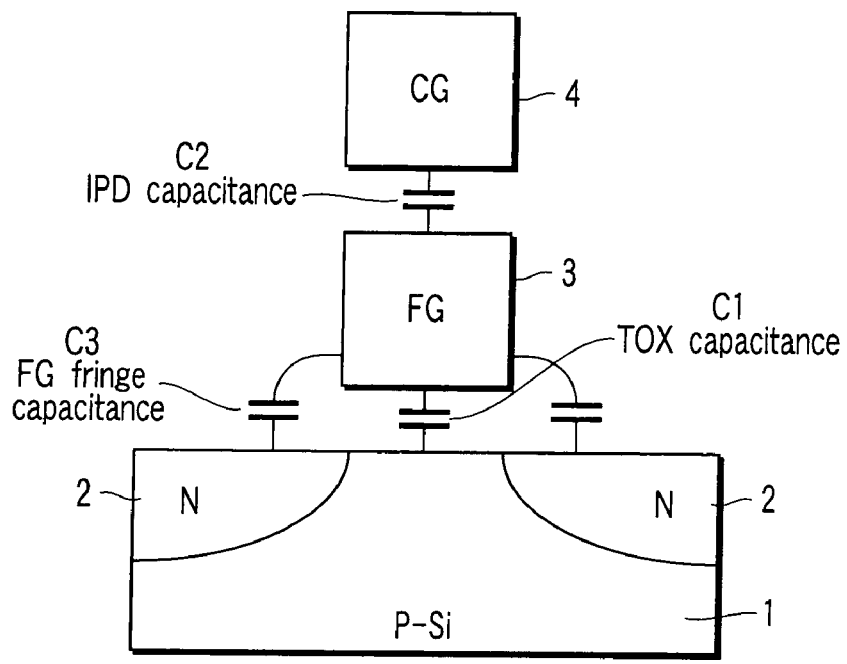
FIG. 3 is a view to explain an influence of FG fringe.

The related art of the invention will be described in detail before the explanation of an embodiment of the present invention. According to the conventional scale reduction technique, floating fringe capacitive coupling (FG fringe coupling) is disregarded. The floating gate fringe capacitive coupling occurs between a floating gate and a diffusion layer of a memory cell. With advances in scale reduction of the floating gate, a non-volatile memory has difficulty sufficiently fulfilling its function. As shown in FIG. 3, the FG fringe coupling means coupling via a capacitance C3 existing between the side of the floating gate and a diffusion layer 2. In addition, the following capacitances C1 and C2 exist. The C1 is a tunnel oxide film capacitance (TOX capacitance) existing between a floating gate 3 and a semiconductor substrate 1. The C2 is an inter-poly dielectric film (IPD) capacitance existing between the floating gate 3 and a control gate 4.

The FG fringe capacitance is characterized in that its magnitude does not change even if scale reduction of a stacked gate is made. This is in contrast to the fact that the IPD capacitance and the TOX capacitance decrease as the facing area becomes narrow with scale reduction. For this reason, the FG fringe capacitance contribution becomes relatively large with the scale reduction.

Figure 4:
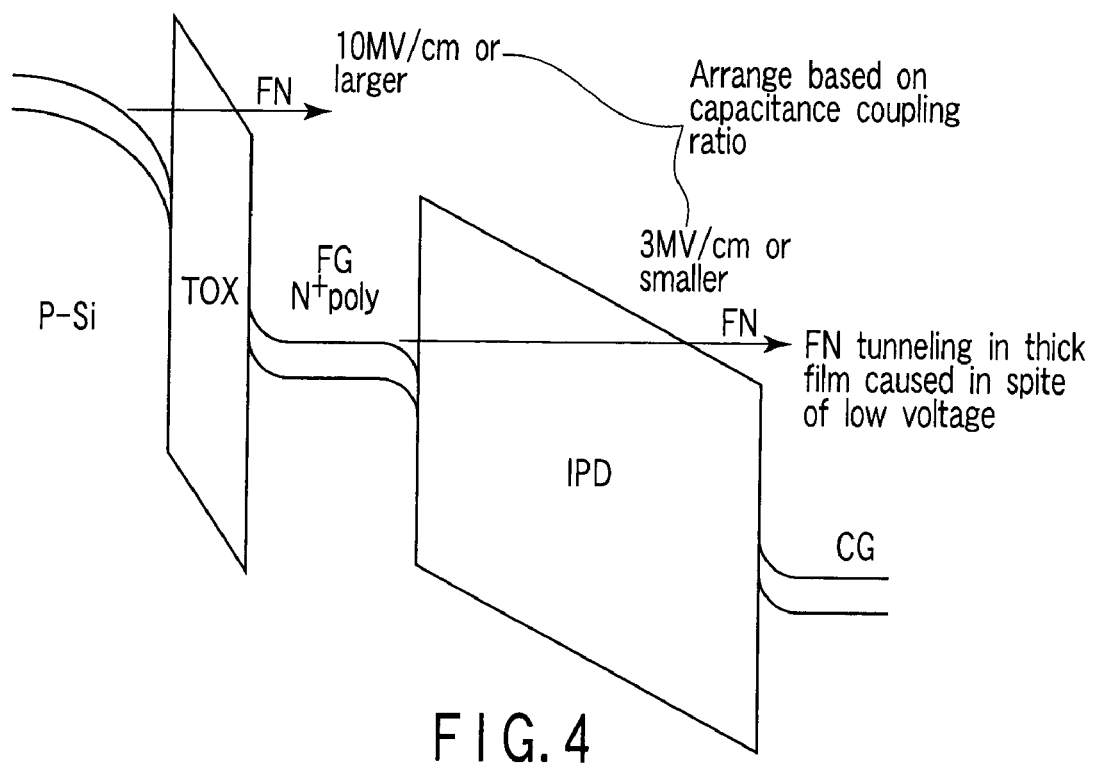
FIG. 4 is an energy band diagram to explain a conventional write method.

The FG fringe coupling contributes to capacitive coupling of the semiconductor substrate 1 with the floating gate 3. Thus, when a FG fringe ratio becomes high, capacitive coupling between the floating gate 3 and the control gate 4 becomes relatively low. As a result, this is a factor of reducing a capacitive coupling ratio. The reduction of the capacitive coupling ratio lowers a ratio to an IPD film (not shown) of an electric field applied to a tunnel film (not shown) between the semiconductor substrate 1 and the floating gate 3. As a result, IPD leak is increased. FIG. 4 is an energy band diagram showing the foregoing state.

In general, the following conditions are preferably required in order to make correct writing. Namely, a voltage (electric field) of 10 MV/cm or larger is applied to a tunnel film (TOX), while a voltage (electric field) applied to the IPD film is controlled to 3 MV/cm or smaller. If the capacitive coupling ratio becomes low, the voltage distribution relationship changes between the tunnel film and the IPD film. As a result, the tunnel film voltage is reduced while the IPD film voltage increases. Therefore, the foregoing conditions are not satisfied. As seen from the foregoing description, it is a serious problem how the capacitive coupling ratio is affected by FG fringe.

The following is a description of the relationship between FG fringe and scale reduction. A tunnel film capacitance is proportional to a gate area, and decreases at a ratio of square of a gate length with the scale reduction. This is considerably faster pace as compared with decrease of FG fringe coupling. Thus, in the generation beyond 55 nm, an influence of FG fringe coupling on the capacitive coupling ratio becomes negligible.

The following is a description of factors of reducing writing efficiency other than the FG fringe. As depicted in an energy band diagram of FIG. 5, a depletion layer is formed at the interface between the floating gate and the tunnel film in a write operation. This reduces the tunnel film voltage with result that writing efficiency is decreased (see H. Watanabe, IEEE TED52, 2265, 2005).

Figure 5:
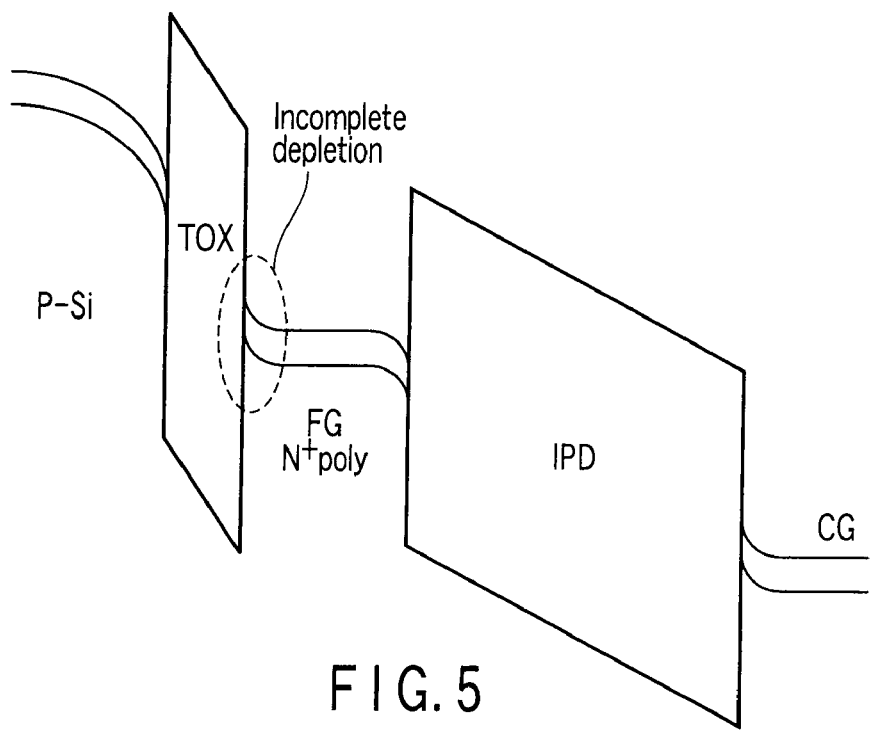
FIG. 5 is an energy band diagram to explain an influence of an incomplete depletion layer.
Figure 6:
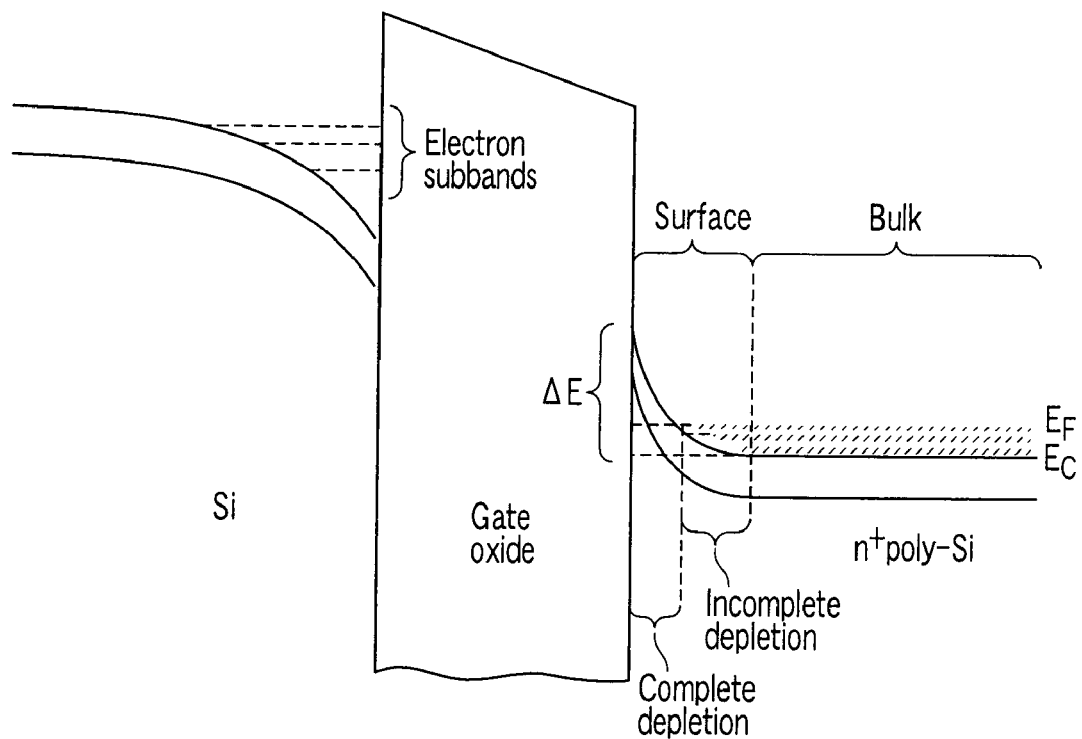
FIG. 6 is a diagram showing the details of a depletion state in a polysilicon gate.

An influence of the depletion layer will be hereinafter considered. FIG. 6 is an energy band diagram showing a state of a depletion layer in an $N^+$ polysilicon gate (see H. Watanabe, IEEE TED52, 2265, 2005). Unlike a silicon substrate, Fermi level exists in a conduction band. Therefore, even if a band bends at the polysilicon surface, there remains an area where electrons are not completely lost (incomplete depletion). Moreover, a complete depletion layer exists between the incomplete depletion layer and an oxide film. However, in fact, the width of the complete depletion layer is remarkably small, so that the depletion layer of an $N^+$ polysilicon gate is dominated by the incomplete depletion layer. It is to be noted that depletion approximation normally applied to silicon presumes complete depletion. Thus, the depletion layer width of the $N^+$ polysilicon gate is underestimated. For this reason, a depletion layer of the floating gate occurring in a write operation is underestimated. In short, as shown in FIG. 5, reduction of the electrical field in the tunnel film owing to FG depletion layer is disregarded so far. However, a write margin becomes smaller with scale reduction, and thereby, the above reduction is a dangerous factor that must be securely removed.

An influence of an accumulation layer will be hereinafter considered. An $N^+$ polysilicon accumulation layer is quite disregarded according to the conventional concept based on Boltzmann approximation. This results from the following reason. Namely, the donor concentration of $N^+$ polysilicon is very high, and if a band is slightly bent on the $N^+$ polysilicon surface, a charge is accumulated according to an exponential function. Thus, it is considered that the band is not almost bent actually. However, the inventors have made a report that the foregoing concept is wrong (see H. Watanabe et al., Ext. Abs. SSDM, 504, 2005).

More specifically, the accumulation layer width of the $N^+$ polysilicon is narrow, and quantum exclusion effect prevents electrons from accumulating according to the exponential function. Conversely, as illustrated in FIG. 7, the band is bent more steeply in order to maintain a surface charge density. Thus, the band drop is steeper as compared with the case expected so far. An electron state density increases in accordance with the square root of the band drop. As described above, charge accumulation is made not according to the exponential function of the band drop, but proportional to the square root of the band drop. Thus, from the foregoing description, the accumulation layer at the $N^+$ polysilicon surface can be called as a weak accumulation layer. FIG. 7B shows a state that no accumulation of electrons occurs.

FIG. 8 shows a state that a weak accumulation layer at FG/IPD film interface generated in a write operation lowers a tunnel barrier of the IPD film. This is a factor of increasing IPD leak on the exponential function, and largely reducing writing efficiency.

As described above, the incomplete depletion layer lowers an electric field of a tunnel film. The FG fringe capacitance lowers the capacitive coupling ratio, and reduces an injection current flowing through the TOX in a write operation. Moreover, the weak accumulation layer at the FG/IPD interface increases IPD leak. The write operation is made based on the difference between the injection current and the IPD leak. Thus, the foregoing incomplete depletion and FG fringe capacitance remarkably lowers writing efficiency. In other words, decrease of writing efficiency is a serious problem of a NAND flash memory in the generation after 55 nm together with scale reduction.

The effective means for collectively solving the foregoing problem is to thin the tunnel film TOX. Thinning of TOX is seemed as if the capacitive coupling ratio is further reduced. However, the effect of increasing the injection current flowing through the TOX is usefully given. Therefore, decrease of writing efficiency by scale reduction is prevented. Conversely, the following demerit is given, that is, data retention characteristic is worsened.

At present, it is said that a reallistic memory card can be designed, if the memory card can hold data for about one year. Actually, when the memory card is connected to power, write transfer of memory (block transfer & block batch erase=flash), that is, refresh is carried out while user is not aware of it.

Therefore, if refresh is carried out while data is held, there is no problem. However, it is needed to teach the refresh timing to the memory card. For example, the data retention time is assumed as one year at the worst, and the memory card is once refreshed when inserted into a reader ten times. In this case, if the memory card is inserted into the reader ten times in one year, data is semi-permanently held.

Actually, memory cards such as Compact Flash (®)used for mobile phones and digital cameras and SD Cards (™) or flash drives are considerably frequently inserted into a reader, or are used in a state of being inserted therein. Moreover, non-volatile memory built into mobile phones and music players is powered almost every day. (Probably, a memory left in a power off state for one year will be a discarded memory.)

It is to be noted that data retention characteristic is variable every memory cell. In other words, a cell having the shortest data retention time determines the data retention characteristic of a memory system. Of course, error correction code (ECC) can prevent use of a cell including non desired data retention time. In this case, time determined according to ECC is equivalent to data retention time of a memory system.

In a NAND flash (memory), a series of serial-connected memory cells is all disposed, for example, if one cell having no desired data retention time exists. Namely, if a range of data retention characteristic is wide, the number of bits disposed based on ECC becomes much. If this number becomes too much, bit cost also becomes high. Of course, the range of the data retention characteristic is different every chip. Thus, the number of bits disposed based on ECC is different every chip. In other words, elimination by ECC is regarded as determination of the maximum value in variations between chips.

Conversely, the tunnel film must be thinned according to advance in scale reduction. This means the number of bits whose data retention time is shortened increases, and the data retention characteristic variation (in particular, data retention time distribution edge) becomes large. In other words, if the shortest data retention time to be eliminated according to ECC is kept, it invites cost increase.

Conversely, if the lower end (edge) of the data retention time range (shortest data retention time) is lessened, refresh timing must be made earlier. For example, the shortest data retention time is set as three months. In order to semi-permanently hold information recorded in the digital camera or the flush drive, the memory (card) must be inserted to a reader ten times for three months. This means that the information is erased depending on users. Instead, if refresh timing is increased as three times per 10 times insertion, user frequently feels that the operation speed is late. Therefore, basically, there is a problem in refresh control according to the number of refreshing times.

Thus, if the data retention time is lessened according to scale reduction, the memory card should be automatically refreshed at timing earlier than the lowest end of the data retention time range. The problem is how to teach refresh timing to the memory card. Furthermore, elapsed time must be measured while the memory card is in a battery-less/off line state.

The inventors provide a non-volatile memory device in which data retention time characteristic is not degraded even if the tunnel film is thinned. In order to realize the foregoing non-volatile memory device, the inventors propose that refresh timing is controlled by elapsed time control instead of frequency control with use of a refresh trigger provided with a power-less semiconductor time switch (aging device: SSAD (™)).

An embodiment of the present invention will be hereinafter described with reference to the accompanying drawings. The present invention is not limited to the following embodiment, and various design change may be made.

EMBODIMENT

FIG. 1 is a block diagram showing the configuration of a non-volatile semiconductor memory device with a refresh trigger using an aging device according to one embodiment of the present invention. According to this embodiment, a controller 101 sends a signal to make first write (initialization) to an SSAD 103. This is equivalent to overturning of an hourglass, and thereby, the initial time is set. The SSAD 103 is different from the actual hourglass in that it can optionally set its lifetime according to the foregoing initialization condition.

The SSAD 103 compares time elapsed from the initialization with the predetermined lifetime. If the elapsed time is shorter than the lifetime, the SSAD prepares to send "0" to a refresh trigger circuit 105. Conversely, if the elapsed time is longer than the lifetime, the SSAD prepares to send "1" to the refresh trigger circuit 105.

In this case, it is to be noted that the time elapse of the SSAD 103 advances in a state disconnected from a power source. The off-power state is maintained until the SSAD 103 becomes able to send 0/1 signal to the refresh trigger 105. When the memory device is connected to an external power and becomes in a power-on state, the 0/1 signal is sent to the refresh trigger circuit 105. If the received signal is "0", the refresh trigger circuit 105 does not make any operation. Conversely, if the received signal is "1", the refresh trigger circuit 105 gives the controller 101 instructions to refresh a memory cell array 115.

The refresh trigger circuit 105 is configured with conventional logic circuits. The circuit 105 forms and amplifies an output waveform of the SSAD 103 to securely operate the controller 101.

The controller 101 controls a word line (WL) decoder 111 and a bit line (BL) decoder 113 using a high-voltage (HV) amplifier 107 and a low-voltage (LV) amplifier (sense amplifier) 109. The controller transfers information recorded in part of a memory cell array 115 to a free space of the memory cell array 115.

In this case, the word line decoder 111 is an X decoder designating a position on the X axis. The bit line decoder 113 is a Y decoder designating a position on the Y axis crossing the X axis. After the write transfer of the memory is completed, the controller 101 again initializes the SSAD 103, and thereby, a series of refresh operation ends.

The refresh operation will be summarized. The SSAD 103 outputs the 0/1 signal only relevant to the lifetime. In contrast, the controller 101 makes various operations such as write, erase, read and address designation. The refresh operation is carried out in the following manner. First, the controller 101 reads data stored in the memory cell array 115 and searches a free space in the memory cell array 115. After finding the free space, the controller 101 writes the read data therein. In this case, the controller 101 erases the data of the read area. After the write transfer of the memory is completed, the controller 101 again initializes the SSAD 103. The foregoing series of operations is pre-stored in the controller 101 as a program. The refresh trigger circuit 105 issues a trigger signal for operating the foregoing program.

According to the foregoing embodiment, when power is turned on after the time set in the SSAD 103 elapses, a refresh signal ("1") is automatically issued. Therefore, even if the tunnel insulating film is thinned, preferable data retention characteristic is maintained.

MODIFICATION EMBODIMENTS

According to the foregoing embodiment, the refresh trigger circuit 105 is used as an independent circuit. Of course, the circuit function may be included in the controller 101 (modification embodiment 1).

According to the foregoing embodiment, the SSAD 103 receives an initialization signal from the controller 101. Instead, the SSAD 103 may receive the signal via HV amplifier 107 or an operational amplifier (op. amp.) 104 (modification embodiment 2). FIG. 2 is a block diagram showing the configuration of a semiconductor memory device according to the foregoing modification embodiment 2.

Specifically, according to the modification embodiment 2, the controller 101 sends a signal to the HV amplifier 107, which drives the operational amplifier 104. The operational amplifier 104 determines whether or not the SSAD 103 should be initialized. Only when the operational amplifier determines that initialization is necessary, the SSAD 103 is initialized. This means that a hourglass is turned over, and thus, the initial time is set. The SSAD 103 optionally sets its lifetime according to the initialization condition, unlike the actual hourglass.

The SSAD 103 compares time elapsed from the initialization with the predetermined lifetime. If the elapsed time is shorter than the lifetime, the SSAD 103 prepares to send a signal "0" to the refresh trigger 105. Conversely, if the elapsed time is longer than the lifetime, the SSAD 103 prepares to send a signal "1" to the refresh trigger 105. In this case, it is to be noted that the time elapse of the SSAD 103 advances with a power source disconnected. An off-power state is maintained until the SSAD 103 becomes able to send 0/1 signal to the refresh trigger 105. When the memory device is connected to an external power and becomes in a power-on state, the 0/1 signal is sent to the refresh trigger circuit 105.

If the received signal is "0", the refresh trigger circuit 105 does not make any operation. Conversely, if the received signal is "1", the refresh trigger circuit 105 gives the operational amplifier 104 instructions to refresh a memory cell array 115. The operational amplifier 104 controls the WL decoder 111 and the BL decoder 113 using the HV amplifier 107 and the LV amplifier 109. Then, the operational amplifier 104 transfers the information recorded in part of the memory cell array 115 to a free space of the memory cell array 115. When the write transfer of the memory is completed, the operational amplifier 104 again initializes the SSAD 103, and thus, a series of refresh operation ends.

As described above, the operational amplifier 104 makes the refresh of the SSAD 103 possible without connecting the controller 101 to the SSAD 103. This improves a degree of freedom in the chip configuration. The operational amplifier 104 has multifunction such as write, erase, read and addressing of a memory cell.

According to the modification embodiment, when the predetermined time set in the SSAD 103 elapses, a refresh signal is automatically issued via the operational amplifier 104. Therefore, even if the tunnel insulating film is thinned, preferable data retention characteristic is maintained.

According to the foregoing embodiment and the modification examples 1 and 2, it is not specifically limited what kind of memory device is used. This means that the present invention is realizable using an arbitrary non-volatile memory device. For example, the following memories are usable as memory cell. One is a semiconductor memory having a floating gate such as NAND flash, NOR flash, and EEPROM. Another is a semiconductor memory having a charge storage layer such as SONOS or MONOS. Still another is a novel memory such as FRAM, FeRAM, PRAM or RRAM. The present invention is also applicable to any memory device on the market, such as an MRAM or hard-disk type magnetic memory. Of course, the present invention is applicable to a DVD media or CD media. Moreover, the present invention is applicable to a logic-memory embedded product such as a semiconductor chip for an IC card.

The minimum unit of information stored in the memory cell array is defined as 1 bit. If the information is configured with 2 bits or more, the information is not necessarily stored on continuous addresses. Rather, there are many cases where the information is stored on non-continuous addresses. A free space addresses searched as the destination transferred in the refresh operation may be non-continuous. However, it is desirable that the number of bits is equal to each other before and after the write transfer.

Moreover, refresh is possible in such a manner that a block including addresses recording the information is transferred to another block as a whole. In this case, the block is one group of the cells on the memory cell array composed of continuous addresses. The foregoing information presumes a state stored in the block. The addresses recording the information are not always continuous in the block. In this case, the capacity of the block must be set larger than that of the information.

Finally, the semiconductor time switch (aging device) used for the present invention will be briefly described. In the present invention, the aging device (JP-A 2004-94922) invented by the inventors is effectively used for another purpose.

Figure 9A:
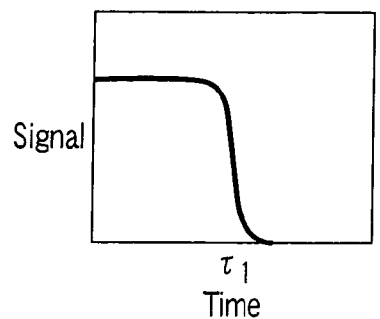
FIGS. 9A to 9D are graphs to explain four basic operation of an SSAD.
Figure 9B:
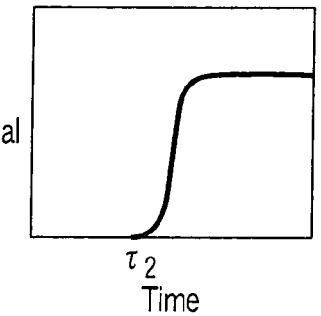
Figure 9C:
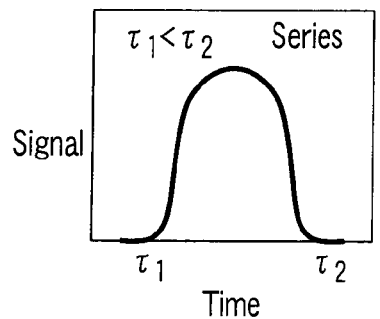
Figure 9D:
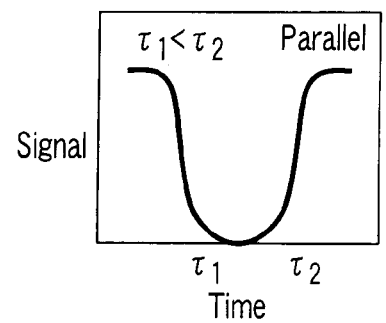

FIGS. 9A to 9D is a view to explain four basic functions of the aging device used for the present invention. FIG. 9A shows a state where, when time elapses and reaches the lifetime ($\tau_1$), the signal present in the aging device so far is extinct. FIG. 9B shows a state where time elapses to reach the lifetime ($\tau_2$) and a signal, which does not exist so far, is generated. FIG. 9C shows a state where, when time elapses and reaches a first lifetime ($\tau_1$), a signal, which does not exist so far, is generated and thereafter, at a second lifetime ($\tau_2$) longer than the first lifetime ($\tau_1$), the signal existing so far is extinct. FIG. 9D shows a state where, when time elapses and reaches the first lifetime ($\tau_1$), the signal existing so far is extinct, and thereafter, at the second lifetime ($\tau_2$) longer than the first lifetime ($\tau_1$), a signal, which does not exist so far, is generated.

Figure 10:
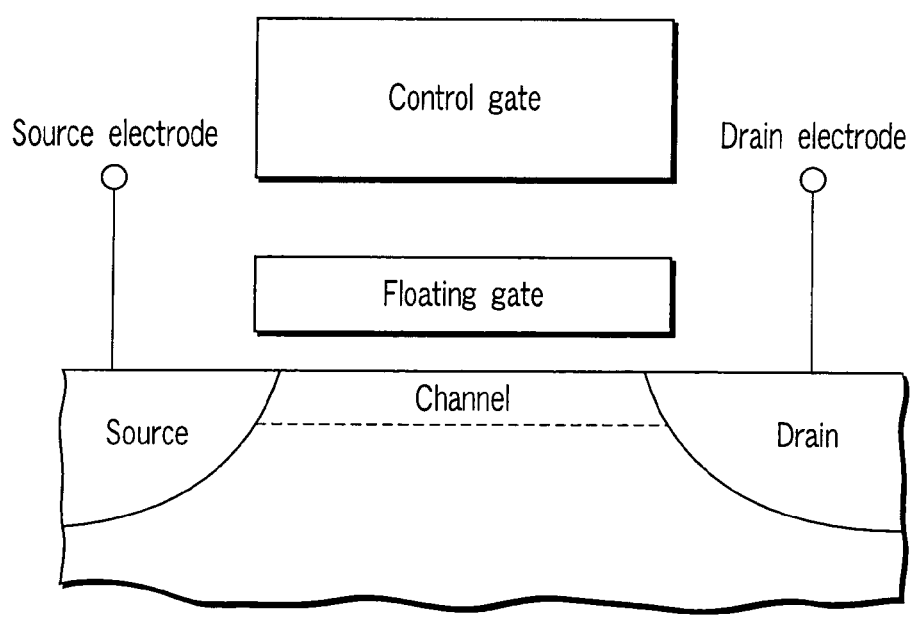
FIG. 10 is a cross-sectional view showing an SSAD having a floating gate.

FIG. 10 is a cross-sectional view showing one example of a single cell of an aging device (SSAD) having a floating gate. When the SSAD and a memory cell are embedded in one chip, the cell structure of the SSAD should be as close as possible to that of a memory cell transistor in order to avoid troublesomeness of the product process. In order to attain this object, the patent applications are independently filed by the inventors in accordance with each structure. Here, FIG. 10 is shown as one example of an SSAD cell. In this case, a write operation (initialization of SSAD) can be performed similarly to NAND flash or NOR flash. In other words, the write operation is performed via FN tunnel injection, or hot electron injection.

In the aging device, the data retention time is shorter as compared to the memory cell. Thus, various designs are contrived in order to control the data retention time (lifetime of SSAD). In FIG. 10, the tunnel film between the floating gate and the channel is formed thinner than that of the memory cell. This utilizes such characteristic that electrons directly tunnel through the floating gate and channel potential changes with elapsed time. This change with elapsed time causes a change with elapsed time of a current (drain current, ID) between the source and drain.

However, a method of realizing the foregoing change with elapsed time is not simply obtained as described above. As seen from FIG. 11, four ways are given in accordance with a transistor type. A normally-on type realizes a function of "Remember" in the aging device (corresponding to FIG. 9B). A normally-off type realizes a function of "Forget" in the aging device (corresponding to FIG. 9A).

According to the normally-off type, electrons (in the case of a pMOSFET) or holes (in the case of an nMOSFET) are accumulated (stored) in the floating gate (write). As a result, the channel is inverted, and the transistor turns on. With elapsed time, electrons or holes leak out of the floating gate, and thus, the transistor turns off. Time is the lifetime of a normally-off SSAD.

Conversely, according to the normally-on type, holes (in the case of a pMOSFET) or electrons (in the case of an nMOSFET) are accumulated (stored) in the floating gate (write). As a result, the channel is turned off. With elapsed time, a charge leaks out of the floating gate, and thus, the transistor turns on. Time is the lifetime of a normally-on SSAD.

The lifetime control of the SSAD is performed by arranging the thickness of the tunnel film; in this case, another method of using the features of the floating gate structure may be employed. As described above, FIG. 9A shows a function of a normally-off aging device, and FIG. 9B shows a function of a normally-on aging device.

FIG. 12 is a cross-sectional view showing one example of an aging device realizing a function of FIG. 9C. A normally-on cell is arranged on the left side and a normally-off cell is arranged on the right side. Aging device cells arranged on the right and left sides may share the same diffusion layer to be connected in series, or, as shown in FIG. 12, the adjacent diffusion layers may be serially connected using an interconnect formed of such as metal.

If the condition that the normally-on type cell and the normally-off type cell are connected in series is satisfied, plural normally-on type cells may be connected in parallel, or plural normally-off type cells may be connected in parallel, as shown in FIG. 13. The above configuration is sometimes necessary in order to precisely control the lifetime of the aging device.

In FIG. 12, the lifetime of the left normally-on type cell is $\tau_1$, and the lifetime of the right normally-on type cell is $\tau_2$. In FIG. 13, the lifetime of the normally-on type cells connected in parallel on the left side is $\tau_1$. The lifetime of the normally-on type cells connected in parallel on the right side is $\tau_2$. In this case, the lifetime has a relationship of $\tau_1$ shorter than $\tau_2$. In this case, $\tau_1$ is a first lifetime, and $\tau_2$ is a second lifetime.

If the normally-off type having the lifetime $\tau_1$ and the normally-on type having the lifetime $\tau_2$ are connected in parallel under the condition that a relation of $\tau_1 < \tau_2$, the function of FIG. 9D is realized.

Therefore, in all functions of FIGS. 9A to 9D, parallel connection of the same type cells having relatively similar lifetime improves controllability of lifetime. FIG. 13 shows one example of connection to improve the controllability.

Four basic operations of the SSAD have been described using the SSAD having the floating gate. Of course, the four basic operations are realized by using various new memories, magnetic memories or DVD/CD media in addition to NAND or NOR flash memories and EEPROM having the floating gate.

In the present invention, use of the function of FIG. 9A or FIG. 9B is preferable in the four functions described in FIGS. 9A to 9D. For example, in initialization, a read signal is sent to the SSAD to read whether the output is on or off. The memory card is taken out of a reader, and it is left for a while as the power is in an off state. While the memory card is left, the SSAD is in an output issuance standby state. The memory card is again inserted into the reader, and when the memory card becomes power-on state, the output of the SSAD is read. If the output of the SSAD is the same as initialized, the refresh trigger issues a refresh signal "0". When the output of the SSAD is different from that at the initialization, the refresh trigger issues a refresh signal "1". When the refresh signal is "0", the memory cell is not refreshed. Conversely, when the refresh signal is "1", the memory cell is refreshed. In this case, a fixed margin called as "offset" must be given between a signal level equivalent to on and a signal level equivalent to off in order to read the signal as a 0/1 digital signal.

Moreover, the data retention time characteristic is different every chip; for this reason, refresh intervals (that is lifetime of aging device) is different. Therefore, it is preferable to arrange the lifetime, which is set in initializing the aging device, in accordance with data retention time of the chip previously measured before delivery (data retention time distribution edge determined according to ECC).

When refresh is carried out every block, the lifetime of the aging device is preferably arranged in its initialization, to adapt to different data retention time of each block. The refresh signals "0" and "1" may be replaced in its function, of course.

According to the present invention, the refresh trigger circuit is used in combination with a battery-less time switch. Therefore, even if the average value of the tunnel film thickness is made small, and bit data retention time is partially shorter than a predetermined standard, there can be provided a non-volatile memory which secures storage contents.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a memory cell array including a plurality of memory cell transistors;
   an X decoder designating a position of an X axis of the memory cell;
   a Y decoder designating a position of a Y axis crossing the X axis;
   a controller collectively controlling operations of read, write and erase of the memory cell transistors via the X decoder and the Y decoder;
   a semiconductor time switch generating an output signal after a predetermined life time elapses without a power source; and
   a refresh trigger circuit receiving the output signal from the semiconductor time switch, and giving the controller instructions to transfer information stored in one area of the memory cell array to other area thereof to refresh the information.

2. The device according to claim 1, wherein an operation of the device comprises the steps of:
   initializing the semiconductor time switch by the controller in a power on state to set the lifetime of the semiconductor time switch;
   leaving the semiconductor time switch in a power off state after said initializing;
   reading an output signal of the semiconductor time switch in the power on state after said leaving;
   by checking a difference between the output signal in the power on state and an output signal at said initializing, issue, through the refresh trigger circuit, a refresh signal "0" when the difference is within a predetermined offset, or issue a refresh signal "1" when the difference is out of the predetermined offset.

3. The device according to claim 2, wherein the controller transfers information stored in one area of the memory cell array to other area thereof to refresh the information when the refresh signal is "1" in the power on state.

4. The device according to claim 2, wherein the lifetime of the semiconductor time switch set in said initializing is shorter than a data retention time of the memory cell transistor in association with the semiconductor time switch.

5. The device according to claim 2, wherein the output signal of the semiconductor time switch changes between before and after the lifetime set in said initializing.

6. The device according to claim 1, wherein at said refreshing the information, the semiconductor time switch is re-initialized.

7. The device according to claim 1, wherein the semiconductor time switch and the memory cell transistor are embedded in the same chip, and each has a floating gate.

8. The device according to claim 1, wherein a capacity of the information before said refreshing is equal to a capacity of the information after said refreshing.

9. The device according to claim 1, wherein, when N is set as an arbitrary natural number and a capacity of the information stored is set as N bits, the N bits are assigned to non-continuous addresses on the memory cell array.

10. The device according to claim 1, wherein a block including addresses recording the information is transferred to and rewritten in another block as a whole.

11. A semiconductor memory device comprising:
a memory cell array including a plurality of memory cell transistors;
an X decoder designating a position of an X axis of the memory cell;
a Y decoder designating a position of a Y axis crossing the X axis;
a controller collectively controlling operations of read, write and erase of the memory cell transistors via the X decoder and the Y decoder;
a semiconductor time switch generating an output signal after a predetermined life time elapses without a power source;
a refresh trigger circuit receiving the output signal from the semiconductor time switch, and giving the controller instructions to transfer information stored in one area of the memory cell array to other area thereof to refresh the information; and
an operational amplifier receiving a refresh signal from the refresh trigger circuit, and making operations of read, write and erase of the memory cell transistors.

12. The device according to claim 11, wherein an operation of the device comprises the steps of:
initializing the semiconductor time switch by the operational amplifier in a power on state to set the lifetime of the semiconductor time switch;
leaving the semiconductor time switch in a power off state after said initializing;
reading an output signal of the semiconductor time switch in the power on state after said leaving;
by checking a difference between the output signal in the power on state and an output signal at said initializing, issue, through the refresh trigger circuit, a refresh signal "0" when the difference is within a predetermined offset, or issue a refresh signal "1" when the difference is out of the predetermined offset.

13. The device according to claim 12, wherein the controller transfers information stored in one area of the memory cell array to other area thereof when the refresh signal is "1" in the power on state.

14. The device according to claim 12, wherein the lifetime of the semiconductor time switch set in said initializing is shorter than a data retention time of the memory cell transistor associated with the semiconductor time switch.

15. The device according to claim 12, wherein the output signal of the semiconductor time switch changes between before and after the lifetime set in said initializing.

16. The device according to claim 11, wherein at said refreshing the information, the semiconductor time switch is re-initialized.

17. The device according to claim 11, wherein the semiconductor time switch and the memory cell transistor are embedded in the same chip, and each has a floating gate.

18. The device according to claim 11, wherein a capacity of the information before said refreshing is equal to a capacity of the information after said refreshing.

19. The device according to claim 11, wherein, when N is set as an arbitrary natural number and a capacity of the information stored is set as N bits, the N bits are assigned to non-continuous addresses on the memory cell array.

20. The device according to claim 11, wherein a block including addresses recording the information is transferred to and rewritten in another block as a whole.

* * * * *